(12) United States Patent
Takamine

(10) Patent No.: US 7,902,940 B2
(45) Date of Patent: *Mar. 8, 2011

(54) DUPLEXER

(75) Inventor: Yuichi Takamine, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/758,823

(22) Filed: Apr. 13, 2010

(65) Prior Publication Data

US 2010/0194495 A1 Aug. 5, 2010

Related U.S. Application Data

(60) Division of application No. 12/210,238, filed on Sep. 15, 2008, now abandoned, which is a continuation of application No. PCT/JP2007/056455, filed on Mar. 27, 2007.

(30) Foreign Application Priority Data

Apr. 6, 2006 (JP) .................................. 2006-105330

(51) Int. Cl.
H03H 9/70 (2006.01)
H03H 9/72 (2006.01)
(52) U.S. Cl. ......................... 333/133; 333/193; 333/195
(58) Field of Classification Search .................. 333/133, 333/193–196; 310/313 B
See application file for complete search history.

(56) References Cited

U.S. PATENT DOCUMENTS

| | | | | |
|---|---|---|---|---|
| 6,046,656 A | * | 4/2000 | Mishima | .................. 333/141 |
| 6,710,676 B2 | * | 3/2004 | Yata et al. | .................. 333/133 |
| 6,744,333 B2 | * | 6/2004 | Sawada | .................. 333/133 |
| 7,683,735 B2 | * | 3/2010 | Shibahara | .................. 333/133 |
| 2002/0109431 A1 | | 8/2002 | Yata et al. | |
| 2004/0080383 A1 | | 4/2004 | Takamine | |
| 2004/0106383 A1 | * | 6/2004 | Yata | .................. 455/91 |
| 2004/0155730 A1 | | 8/2004 | Iwamoto et al. | |
| 2004/0212452 A1 | * | 10/2004 | Tsutsumi et al. | .................. 333/133 |
| 2006/0181369 A1 | * | 8/2006 | Shibahara | .................. 333/195 |

FOREIGN PATENT DOCUMENTS

| | | |
|---|---|---|
| DE | 198 18 038 A1 | * 11/1999 |
| EP | 1 227 584 A1 | 7/2002 |
| EP | 1 365 509 A1 | 11/2003 |

(Continued)

OTHER PUBLICATIONS

Takamine; "Duplexer"; U.S. Appl. No. 12/210,238, filed Sep. 15, 2008.
Official Communication issued in corresponding Chinese Patent Application No. 200780011532.3, mailed on Apr. 14, 2010.
Official Communication issued in corresponding European Patent Application No. 10163359.2, mailed on Jul. 20, 2010.

(Continued)

*Primary Examiner* — Barbara Summons
(74) *Attorney, Agent, or Firm* — Keating & Bennett, LLP

(57) ABSTRACT

A duplexer includes a transmission filter having a ladder circuit configuration and a reception filter. The reception filter includes an input terminal connected to an antenna terminal, a first reception output terminal, and a second reception output terminal. A first filter element and a second filter element, each of which is a longitudinally coupled resonator filter element including a plurality of IDTs, are connected in parallel to the input terminal so that IDTs are connected to the input terminal. The first filter element the second filter element are connected to the first reception output terminal and the second reception output terminal, respectively.

4 Claims, 9 Drawing Sheets

FOREIGN PATENT DOCUMENTS

| | | |
|---|---|---|
| JP | 2002-300005 A | 10/2002 |
| JP | 2002-374147 A | 12/2002 |
| JP | 2004-112594 A | 4/2004 |
| JP | 2006-229487 A | 8/2006 |
| JP | 2006-237727 A | 9/2006 |
| JP | 2006-246145 A | 9/2006 |
| JP | 60-65610 A | 1/2011 |

OTHER PUBLICATIONS

Koshino et al., "A Wide-band Balanced SAW Filter with Longitudinal Multi-mode Resonator", IEEE Ultrasonics Symposium, Oct. 22, 2000, pp. 387-390.

Official Communication issued in corresponding Japanese Patent Application No. 2008-509785, mailed on Dec. 7, 2010.

* cited by examiner

DUPLEXER

BACKGROUND OF THE INVENTION

1. Field of the Invention

The present invention relates to duplexers connected to an antenna terminal in a communication apparatus, such as a mobile telephone, and, more particularly, to a duplexer including a reception filter that utilizes an elastic wave filter device including a plurality of IDTs arranged on a piezoelectric substrate.

2. Description of the Related Art

Components included in an RF stage connected to an antenna in a mobile telephone have been combined to enable miniaturization of the mobile telephone. To achieve the miniaturization, a duplexer including an antenna terminal, a transmission band-pass filter, a reception band-pass filter, a transmission terminal, a reception terminal, and an output terminal is commonly used. Furthermore, a balanced duplexer has been developed in which a balanced band-pass filter having a balanced-to-unbalanced conversion function is used as a reception band-pass filter. Such a balanced duplexer includes an antenna terminal, a transmission terminal, a first reception output terminal, and a second reception output terminal.

Japanese Unexamined Patent Application Publication No. 2003-249842 discloses a balanced duplexer illustrated in FIG. 16. In a balanced duplexer 1001, an antenna terminal 1002 is connected to a transmission filter 1003 and a reception filter 1004. The transmission filter 1003 has a ladder circuit configuration in which a plurality of surface acoustic wave resonators are connected in a ladder arrangement. The transmission filter 1003 having a ladder circuit configuration includes a transmission terminal 1005 at one end thereof that is opposite to the other end connected to the antenna terminal 1002.

On the other hand, the reception filter 1004 includes an input terminal 1006 connected to the antenna terminal 1002, a first reception output terminal 1007, and a second reception output terminal 1008. The input terminal 1006 is connected to 3-IDT longitudinally coupled resonator surface acoustic wave filter portions 1009 and 1010. The longitudinally coupled resonator surface acoustic wave filter portions 1009 and 1010 are connected to 3-IDT longitudinally coupled resonator surface acoustic wave filter portions 1011 and 1012, respectively. The longitudinally coupled resonator surface acoustic wave filter portions 1009 and 1011 are cascade connected. The longitudinally coupled resonator surface acoustic wave filter portions 1010 and 1012 are similarly cascade connected.

One end of the center IDT of the longitudinally coupled resonator surface acoustic wave filter portion 1011 and one end of the center IDT of the longitudinally coupled resonator surface acoustic wave filter portion 1012 are connected to each other and are then electrically connected to the first reception output terminal 1007. The other ends of the center IDTs of the longitudinally coupled resonator surface acoustic wave filter portions 1011 and 1012 are connected to each other and are then electrically connected to the second reception output terminal 1008.

In the reception filter 1004, the ratio of input impedance to input impedance is set to about 1:1. Furthermore, as described above, since input electric power is distributed between the longitudinally coupled resonator surface acoustic wave filter portions 1009 and 1010 in the reception filter 1004, the power handling performance can be improved.

Japanese Unexamined Patent Application Publication No. 2003-347964 discloses a 3-IDT longitudinally coupled resonator surface acoustic wave filter 1021 illustrated in FIG. 17. The longitudinally coupled resonator surface acoustic wave filter 1021 includes a first IDT 1022, a second IDT 1023, and a third IDT 1024 which are arranged along a surface acoustic wave propagation direction. The center IDT 1023 includes a first sub-IDT portion 1023a and a second sub-IDT portion 1023b which are obtained by dividing the center IDT 1023 in the surface acoustic wave propagation direction. The IDTs 1022 and 1024 are connected to an input terminal 1025. The first sub-IDT portion 1023a and the second sub-IDT portion 1023b are connected to a first output terminal 1026 and a second output terminal 1027, respectively.

The 3-IDT longitudinally coupled resonator surface acoustic wave filter 1021 can be used as a reception filter in the above-described balanced duplexer. In the longitudinally coupled resonator surface acoustic wave filter 1021, a ratio of output impedance to input impedance is set to a value greater than about one. Accordingly, if the longitudinally coupled resonator surface acoustic wave filter 1021 is used as a reception filter in the above-described balanced duplexer, impedance matching between a balanced output including first and second reception outputs, and a balanced input located at a subsequent stage of the reception filter in a mobile telephone can be easily achieved.

In the balanced duplexer 1001 disclosed in Japanese Unexamined Patent Application Publication No. 2003-249842, the power handling performance is improved in the reception filter 1004 as described above. However, if the first reception output terminal 1007 and the second reception output terminal 1008, which are included in the reception filter 1004, are connected to a balanced input included in the subsequent stage of the reception filter 1004 in a mobile telephone, impedance matching cannot be achieved since the ratio of input impedance to output impedance of the reception filter 1004 is about 1:1. As a result, a large ripple is generated in a passband.

As described above, if the longitudinally coupled resonator surface acoustic wave filter 1021 disclosed in Japanese Unexamined Patent Application Publication No. 2003-347964 is used as a reception filter in the above-described balanced duplexer, impedance matching between the reception filter and a subsequent stage can be easily achieved. However, the longitudinally coupled resonator surface acoustic wave filter 1021 does not have sufficient power handling performance. Accordingly, if the longitudinally coupled resonator surface acoustic wave filter 1021 is used in a duplexer, the longitudinally coupled resonator surface acoustic wave filter 1021 can be easily damaged by the electric power supplied thereto from a transmission filter.

A relatively large amount of electric power enters a reception filter, especially if a transmission filter is a ladder surface acoustic wave filter having a ladder circuit configuration in which a plurality of surface acoustic wave resonators are connected. Accordingly, in this case, higher power handling performance is required for the reception filter. Accordingly, a filter having insufficient power handling performance, for example, the longitudinally coupled resonator surface acoustic wave filter 1021, cannot be used as a reception filter in a duplexer including a ladder surface acoustic wave filter that functions as a transmission filter.

Examples of a surface acoustic wave filter have been described. As similar filters, elastic boundary wave filters are known. Similar to surface acoustic wave filters, elastic boundary wave filters include reflectors and an IDT, which are made of a thin metal film, on a piezoelectric substrate. For example, an elastic boundary wave filter is obtained by providing an Al filter electrode including an IDT and reflectors on the surface of a piezoelectric monocrystal substrate and providing an $SiO_2$ thin film having a sufficient thickness on the filter electrode. The $SiO_2$ thin film has an elastic constant or density that is different from that of the piezoelectric monocrystal. Although the principle of operation of elastic boundary wave filters and the structure of elastic boundary wave filters are similar to those of surface acoustic wave filters, the elastic boundary wave filters have a solid layer disposed on the surface of a piezoelectric substrate. The elastic boundary filters are operated by the interaction between an IDT and an elastic wave (elastic boundary wave) propagating through the boundary between the piezoelectric substrate and the solid layer. In contrast to surface acoustic wave filters that require a package having a cavity to protect the surface of a substrate, boundary acoustic wave filters have an advantage in that they do not require such a package having a cavity since a wave propagates through a boundary surface between a piezoelectric monocrystal substrate and a thin film.

Surface acoustic wave filters operate using a surface acoustic wave propagating on the surface of a piezoelectric substrate, whereas elastic boundary wave filters operate using an elastic boundary wave propagating through the boundary between a piezoelectric substrate and a solid layer. Basically, both types of filters have similar principles of operation. Furthermore, similar design methods used for these types of filters.

SUMMARY OF THE INVENTION

To overcome the problems described above, preferred embodiments of the present invention provide a reliable balanced duplexer that includes a reception filter with a balanced-to-unbalanced conversion function and a transmission filter and is capable of easily achieving impedance matching when the balanced output of the reception filter is connected to the subsequent stage and preventing the reception filter from being damaged due to electric power supplied to the reception filter from the transmission filter.

In the preferred embodiments described below, description will be provided with reference to a surface acoustic wave filter. As described above, however, an elastic boundary wave filter having substantially the same electrode configuration as that of the surface acoustic wave filter can provide substantially the same operational advantages.

According to a preferred embodiment of the present invention, a balanced duplexer includes a transmission filter having a ladder circuit configuration and a reception filter. One end of the transmission filter and one end of the reception filter are connected to each other and are then connected to an antenna terminal. The reception filter is defined by a balanced surface acoustic wave filter device that includes an input terminal connected to the antenna terminal, first and second reception output terminals used to obtain a reception output, a piezoelectric substrate, and a plurality of IDTs provided on the piezoelectric substrate.

In a first preferred embodiment of the present invention, in the reception filter, a first filter element and a second filter element are defined by the piezoelectric substrate and the IDTs. The first filter element includes on the piezoelectric substrate a first longitudinally coupled resonator elastic wave filter portion and a second longitudinally coupled resonator elastic wave filter portion which are cascade connected and each of which includes a second IDT, a first IDT, and a third IDT which are disposed in this order along an elastic wave propagation direction. The first IDT included in the first longitudinally coupled resonator elastic wave filter is connected to the input terminal, and the first IDT included in the second longitudinally coupled resonator elastic wave filter portion is connected to the first reception output terminal. The second and third IDTs included in the first longitudinally coupled resonator elastic wave filter portion are electrically connected to the second and the third IDTs included in the second longitudinally coupled resonator elastic wave filter portion, respectively. The second filter element includes a third longitudinally coupled resonator elastic wave filter portion and a fourth longitudinally coupled resonator elastic wave filter portion which are cascade connected and each of which includes a second IDT, a first IDT, and a third IDT which are disposed in this order along the elastic wave propagation direction. The first IDT included in the third longitudinally coupled resonator elastic wave filter portion is connected to the input terminal, and the first IDT included in the fourth longitudinally coupled resonator elastic wave filter portion is connected to the second reception output terminal. The second and third IDTs included in the third longitudinally coupled resonator elastic wave filter portion are electrically connected to the second and third IDTs included in the fourth longitudinally coupled resonator elastic wave filter portion, respectively. A phase of an output signal with respect to an input signal of the second filter element differs by about 180 degrees from a phase of an input signal with respect to an output terminal of the first filter element.

In a second preferred embodiment of the present invention, a first filter element and a second filter element are defined by the piezoelectric substrate and the IDTs. Each of the first and second filter elements is a longitudinally coupled resonator filter element including a second IDT, a first IDT, and a third IDT which are disposed in this order on the piezoelectric substrate along an elastic wave propagation direction. A phase of an output signal with respect to an input signal of the second filter element differs by about 180 degrees from a phase of an output signal with respect to an input signal of the first filter element. Each of the second and third IDTs or the first IDT included in the first filter element is connected to the input terminal, and the first IDT or each of the second and third IDTs included in the first filter element is connected to the first reception output terminal. Each of the second and third IDTs or the first IDT included in the second filter element is connected to the input terminal, and the first IDT or each of the second and third IDTs included in the second filter element is connected to the second reception output terminal.

In a third preferred embodiment of the present invention, the reception filter is preferably a longitudinally coupled resonator filter element including an input terminal, first and second reception output terminals, a piezoelectric substrate, fourth, second, first, third, and fifth IDTs which are arranged in this order on the piezoelectric substrate along an elastic wave propagation direction, and first and second reflectors, one of which is disposed on one side of an area in which the first to fifth IDTs are disposed and the other one of which is disposed on the other side of the area. The second IDT is about 180 degrees out of phase with the third IDT. The first, fourth, and fifth IDTs are connected to the input terminal, the second IDT is connected to the first reception output terminal, and the third IDT is connected to the second reception output terminal.

In a fourth preferred embodiment of the present invention, the reception filter is a longitudinally coupled resonator filter element including an input terminal, first and second received signal output terminals, a piezoelectric substrate, fourth, second, first, third, and fifth IDTs which are arranged in this order on the piezoelectric substrate along an elastic wave propagation direction, and first and second reflectors, one of which is disposed on one side of an area in which the first to fifth IDTs are disposed and the other one of which is disposed on the other side of the area. The second IDT is about 180 degrees out of phase with the third IDT. The second and third IDTs are connected to the input terminal. The first IDT includes first and second sub-IDT portions obtained by dividing the first IDT in the elastic wave propagation direction, the first sub-IDT portion and the fourth IDT are connected to the first reception terminal, and the second sub-IDT portion and the fifth IDT are connected to the second reception output terminal.

In a fifth preferred embodiment of the present invention, the reception filter includes an input terminal, first and second reception output terminals, and first and second longitudinally coupled resonator elastic wave filter elements which are cascade connected. Each of the first and second longitudinally coupled resonator elastic wave filter elements includes fourth, second, first, third, and fifth IDTs which are arranged in this order on a piezoelectric substrate along an elastic wave propagation direction, and first and second reflectors between which the first to fifth IDTs are sandwiched. The second IDTs included in the first and second longitudinally coupled resonator elastic wave filter elements are connected to each other. The third IDTs included in the first and second longitudinally coupled resonator elastic wave filter elements are connected to each other. In the first longitudinally coupled resonator elastic wave filter element, the second IDT is about 180 degrees out of phase with the third IDT. The first, fourth, and fifth IDTs included in the first longitudinally coupled resonator elastic wave filter element are connected to the input terminal. The first IDT included in the second longitudinally coupled resonator elastic wave filter element includes first and second sub-IDT portions obtained by dividing the first IDT in the elastic wave propagation direction. The first sub-IDT portion and the fourth IDT which are included in the second longitudinally coupled resonator elastic wave filter element are connected to the first reception output terminal. The second sub-IDT portion and the fifth IDT which are included in the second longitudinally coupled resonator elastic wave filter element are connected to the second reception output terminal.

In a sixth preferred embodiment of the present invention, the reception filter includes an input terminal, first and second reception output terminals, and first, second, third, and fourth longitudinally coupled resonator filter elements. A phase of an output signal with respect to an input signal of the first longitudinally coupled resonator filter element being different by about 180 degrees from that of the second longitudinally coupled resonator filter element. A phase of an output signal with respect to an input signal of the third longitudinally coupled resonator filter element is different by about 180 degrees from that of the fourth longitudinally coupled resonator filter element. Each of the first to fourth longitudinally coupled resonator filter elements includes a plurality of IDTs and is connected to the input terminal via at least one of the plurality of IDTs. The IDTs of the first to fourth longitudinally coupled resonator filter elements which are connected to the input terminal are connected in parallel to each other. The third longitudinally coupled resonator filter element is connected to the first reception output terminal via another one of the plurality of IDTs, and the fourth longitudinally coupled resonator filter element is connected to the second reception output terminal via another one of the plurality of IDTs. The IDT of the third longitudinally coupled resonator filter element which is connected to the first reception output terminal is connected in series to a corresponding one of the plurality of IDTs of the first longitudinally coupled resonator filter element. The IDT of the fourth longitudinally coupled resonator filter element which is connected to the second reception output terminal is connected in series to a corresponding one of the plurality of IDTs of the second longitudinally coupled resonator filter element.

In a seventh preferred embodiment of the present invention, the reception filter includes an input terminal, first and second reception output terminals, a piezoelectric substrate, and first and second 3-IDT longitudinally coupled resonator elastic wave filter portions provided on the piezoelectric substrate. The first elastic wave filter portion includes second, first, and third IDTs which are arranged in this order along an elastic wave propagation direction. The second elastic wave filter portion includes fifth, fourth, and sixth IDTs which are arranged in this order along the elastic wave propagation direction. The input terminal is connected to the second and third IDTs of the first elastic wave filter portion and the fifth and sixth IDTs of the second elastic wave filter portion. Each of the first IDT of the first elastic wave filter portion and the fourth IDT of the second elastic wave filter portion includes first and second sub-IDT portions obtained by dividing the IDT in a cross width direction substantially perpendicular to the elastic wave propagation direction, the first and second sub-IDT portions are electrically connected in series to each other, the second sub-IDT portion of the first elastic wave filter portion is connected to the first reception output terminal, and the second sub-IDT portion of the second elastic wave filter portion is connected to the second reception output terminal. The first to sixth IDTs are arranged so that an electric signal passing through the first reception output terminal is about 180 degrees out of phase with an electric signal passing through the second reception output terminal.

In an eighth preferred embodiment of the present invention, the reception filter includes an input terminal, first and second reception output terminals, a piezoelectric substrate, and first and second 3-IDT longitudinally coupled resonator elastic wave filter portions provided on the piezoelectric substrate. The first elastic wave filter portion includes second, first, and third IDTs which are arranged in this order along an elastic wave propagation direction. The second elastic wave filter portion includes fifth, fourth, and sixth IDTs which are arranged in this order along the elastic wave propagation direction. The input terminal is connected to the second and third IDTs of the first elastic wave filter portion and the fifth and sixth IDTs of the second elastic wave filter portion. Each of the first IDT of the first elastic wave filter portion and the fourth IDT of the second elastic wave filter portion includes first and second sub-IDT portions obtained by dividing the IDT in the elastic wave propagation direction, the first and second sub-IDT portions are electrically connected in series to each other, the first sub-IDT portion of the first elastic wave filter portion is connected to the first reception output terminal, and the first sub-IDT portion of the second elastic wave filter portion is connected to the second reception output terminal. The first to sixth IDTs are arranged so that an electric signal passing through the first reception output terminal is about 180 degrees out of phase with an electric signal passing through the second reception output terminal.

In a ninth preferred embodiment of the present invention, the reception filter includes an input terminal, first and second reception output terminals, a piezoelectric substrate, and first and second 3-IDT longitudinally coupled resonator elastic wave filter portions provided on the piezoelectric substrate. The first elastic wave filter portion includes second, first, and third IDTs which are arranged in this order along an elastic wave propagation direction. The second elastic wave filter portion includes fifth, fourth, and sixth IDTs which are arranged in this order along the elastic wave propagation direction. The first to sixth IDTs are arranged so that a phase difference between an input signal and an output signal in the first elastic wave filter portion differs by about 180 degrees from a phase difference between an input signal and an output signal in the second elastic wave filter portion. The first and fourth IDTs are connected to the input terminal. The second and third IDTs of the first elastic wave filter portion are electrically connected in series to each other and are then connected to the first reception output terminal. The fifth and sixth IDTs of the second elastic wave filter portion are electrically connected in series to each other and are then connected to the second reception output terminal.

According to the first to ninth preferred embodiments of the present invention, as described above, a reception filter defined by a balanced longitudinally coupled resonator elastic wave filter is provided which has a ratio of output impedance to input impedance that is greater than about one. Accordingly, if the reception filter is connected to a balanced input included in a subsequent stage, impedance matching can be easily achieved.

According to the first to ninth preferred embodiments of the present invention, the power handling performance is improved since the input terminal is connected in parallel to a plurality of IDTs or to a plurality of elastic wave filter portions.

In a duplexer according to a preferred embodiment of the present invention, a signal line passing through at least one of signal lines used to cascade connect a plurality of longitudinally coupled resonator elastic wave filter portions is substantially opposite in phase to an electric signal passing through the other ones of the signal lines. Accordingly, the amplitude balance and the phase balance between the first and second reception output terminals are improved.

In a duplexer according to another preferred embodiment of the present invention, at least one resonator is further included. The resonator is connected in series between the reception filter and a node at which one end of the transmission filter and one end of the reception filter are connected to each other. In this case, the phase matching between the transmission filter and the reception filter can be achieved. Accordingly, a transmission line or an element for phase matching, for example, an inductor or a capacitor, is not required. As a result, the mounting area can be reduced.

A duplexer according to preferred embodiments of the present invention may include one of a surface acoustic wave and an elastic boundary wave as the elastic wave. The longitudinally coupled resonator elastic wave filter and the one one-port elastic wave resonator preferably utilize a surface acoustic wave. However, the longitudinally coupled resonator elastic wave filter and the one-port elastic wave resonator can also utilize an elastic boundary wave.

In the first to ninth preferred embodiments of the present invention, a duplexer includes a transmission filter having a ladder circuit configuration and a reception filter. The reception filter includes a balanced elastic wave filter device that includes an input terminal and first and second reception output terminals. In the first to ninth preferred embodiments of the present invention, the ratio of output impedance to input impedance of the reception filter is set to a value greater than about one. Accordingly, if the first and second reception output terminals are connected to a balanced input included in a subsequent stage, impedance matching can be easily achieved. Furthermore, in the first to ninth preferred embodiments of the present invention, since the input terminal of the reception filter is connected in parallel to a plurality of IDTs or to a plurality of elastic wave filter portions, the power handling performance can be improved. If a transmission filter having a ladder circuit configuration is used, a relatively large amount of electric power is likely to enter the reception filter. However, according to preferred embodiments of the present invention, a reliable duplexer is capable of preventing the reception filter from being damaged due to electric power supplied thereto.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described in detail below with reference to the accompanying drawings.

First Preferred Embodiment

Figure 1:
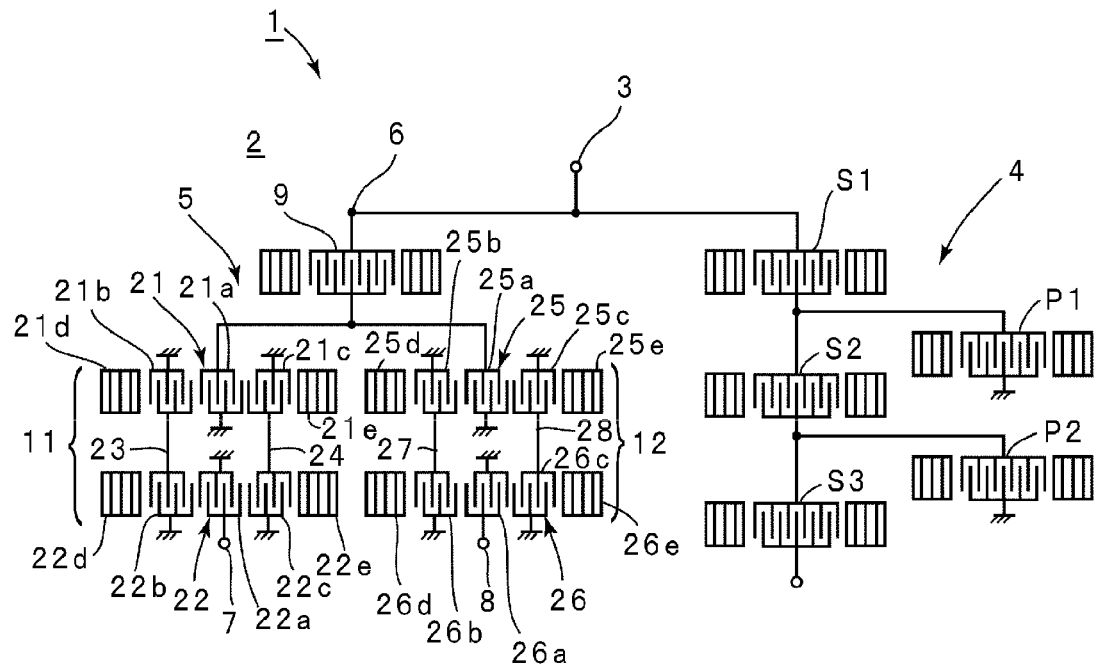
FIG. 1 is a schematic plan view illustrating an electrode structure of a duplexer according to a first preferred embodiment of the present invention.

FIG. 1 is a schematic plan view describing a circuit configuration of a balanced duplexer according to the first preferred embodiment of the present invention. A duplexer 1 according to this preferred embodiment is preferably used in mobile telephones for CDMA800, for example. In CDMA800, a transmission frequency band is 824 to 849 MHz and a reception frequency band is 869 to 894 MHz.

In the balanced duplexer 1, an electrode structure illustrated in FIG. 1 is provided on a piezoelectric substrate 2. The piezoelectric substrate 2 is preferably a 42° Y-cut X-propagation $LiTaO_3$ substrate, for example. The material of a piezoelectric substrate is not particularly limited. A $LiTaO_3$ substrate having another cutting angle may be used. Alternatively, a piezoelectric substrate made of another piezoelectric material such as $LiNbO_3$ may be used.

The balanced duplexer 1 includes an antenna terminal 3 connected to an antenna. The antenna terminal 3 is connected to a transmission filter 4 and a reception filter 5. The transmission filter 4 is a ladder band-pass filter in which a plurality of one-port surface acoustic wave resonators are disposed on a piezoelectric substrate. That is, the transmission filter 4 is a surface acoustic wave filter device having a ladder circuit configuration including a plurality of series arm resonators S1, S2, and S3 and a plurality of parallel arm resonators P1 and P2.

Although the transmission filter 4 has a circuit configuration including three series arm resonators S1 to S3 and two parallel arm resonators P1 and P2 in this preferred embodiment, the ladder circuit configuration of the transmission filter is not limited to this configuration. That is, a ladder filter including any number of series arm resonators and any number of parallel arm resonators can be used as a transmission filter.

In any duplexer including a transmission filter having a ladder circuit configuration and a reception filter, a relatively large amount of electric power is likely to enter the reception filter from the transmission filter.

The reception filter 5 is a balanced band-pass filter including an input terminal 6, a first reception output terminal 7, and a second reception output terminal 8. The input terminal 6 is connected to the antenna terminal 3.

In the reception filter 5, one end of a one-port surface acoustic wave resonator 9 is connected to the input terminal 6 and the other end of the surface acoustic wave resonator 9 is connected to one end of a first filter element 11 and one end of a second filter element 12. Each of the first filter element 11 and the second filter element 12 includes a plurality of IDTs arranged on the piezoelectric substrate 2 as illustrated in FIG. 1. In the first filter element 11, a first longitudinally coupled resonator surface acoustic wave filter portion 21 and a second longitudinally coupled resonator surface acoustic wave filter portion 22 are cascade connected. The first longitudinally coupled resonator surface acoustic wave filter portion 21 includes a second IDT 21b, a first IDT 21a, and a third IDT 21c which are arranged in this order along a surface acoustic wave propagation direction. A reflector 21d is disposed on one side of an area in which the first to third IDTs 21a to 21c are disposed in the surface acoustic wave propagation direction, and a reflector 21e is disposed on the other side of the area.

A second longitudinally coupled resonator surface acoustic wave filter portion 22 has substantially the same structure as the first longitudinally coupled resonator surface acoustic wave filter portion 21 including a second IDT 22b, a first IDT 22a, a third IDT 22c, and reflectors 22d and 22e. The second IDT 22b, the first IDT 22a, and the third IDT 22c are arranged in this order along the surface acoustic wave propagation direction.

One end of the center IDT 21a of the first longitudinally coupled resonator surface acoustic wave filter portion 21 is connected to the input terminal 6 via the one-port surface acoustic wave resonator 9. One end of the center IDT 22a of the second longitudinally coupled resonator surface acoustic wave filter portion 22 is connected to the first reception output terminal 7. The second IDTs 21b and 22b are connected to each other via a signal line 23 and the third IDTs 21c and 22c are connected to each other via a signal line 24, whereby the first longitudinally coupled resonator surface acoustic wave filter portion 21 and the second longitudinally coupled resonator surface acoustic wave filter portion 22 are cascade connected.

The second filter element 12 preferably has substantially the same structure as that of the first filter element 11, and includes a third longitudinally coupled resonator surface acoustic wave filter portion 25 and a fourth longitudinally coupled resonator surface acoustic wave filter portion 26 which are cascade connected. The third longitudinally coupled resonator surface acoustic wave filter portion 25 includes a second IDT 25b, a first IDT 25a, and a third IDT 25c, which are arranged in this order along a surface acoustic wave propagation direction, and reflectors 25d and 25e. The fourth longitudinally coupled resonator surface acoustic wave filter portion 26 includes a second IDT 26b, a first IDT 26a, and a third IDT 26c, which are arranged in this order along the surface acoustic wave propagation direction, and reflectors 26d and 26e. One end of the first IDT 25a, which is the center IDT of the third longitudinally coupled resonator surface acoustic wave filter portion 25, is connected to the input terminal 6 via the one-port surface acoustic wave resonator 9. One end of the first IDT 26a, which is the center IDT of the fourth longitudinally coupled resonator surface acoustic wave filter portion 26, is connected to the second reception output terminal 8. The second IDTs 25b and 26b are electrically connected to each other via a signal line 27 and the third IDTs 25c and 26c are electrically connected to each other via a signal line 28, whereby the third longitudinally coupled resonator surface acoustic wave filter portion 25 and the fourth longitudinally coupled resonator surface acoustic wave filter portion 26 are cascade connected.

Signals passing through the signal lines 23 and 27 are substantially in phase with each other, and signals passing through the signal lines 24 and 28 are substantially in phase with each other. However, the phase of an output signal with respect to an input signal in the fourth longitudinally coupled resonator surface acoustic wave filter portion 26 differs by about 180° from the phase of an output signal with respect to an input signal in the second longitudinally coupled resonator surface acoustic wave filter portion 22. That is, the first IDT 26a is about 180° out of phase with the first IDT 22a. Accordingly, a pair of balanced output signals can be obtained from the first reception output terminal 7 and the second reception output terminal 8.

In this preferred embodiment of the present invention, a signal passing through one of signal lines used for the cascade connection is about 180° out of phase with a signal passing through the other one of the signal lines. More specifically, in the first filter element 11, an electric signal passing through the signal line 23 is about 180° out of phase with an electric signal passing through the signal line 24. In the second filter element 12, an electric signal passing through the signal line 27 is about 180° out of phase with an electric signal passing through the signal line 28. Accordingly, the electrode fingers adjacent to each other between the first IDT 22a and the second and third IDTs 22b, 22c on both sides of the first IDT 22a have substantially the same polarity arrangement as the electrode fingers adjacent to each other between the first IDT 26a and the second and third IDTs 26b, 26c on both sides of the first IDT 26a. The first IDT 26a is the center IDT of the second longitudinally coupled resonator surface acoustic wave filter portion 22 and the first IDT 26a is the center IDT of the fourth longitudinally coupled resonator surface acoustic wave filter portion 26. Here, each of the longitudinally coupled resonator surface acoustic wave filter portions 22 and 26 is located at a subsequent stage in the cascade connection structure. Consequently, the phase balance and the amplitude balance between the first reception output terminal 7 and the second reception output terminal 8 is improved. This prevents the deterioration of isolation between the transmission filter 4 and the reception filter 5 due to the deterioration of the phase balance and the amplitude balance, such that the isolation is improved.

In this preferred embodiment of the present invention, since the one-port surface acoustic wave resonator 9 is connected in series between the input terminal 6 and each of the first filter element 11 and the second filter element 12, the phase matching between the transmission filter 4 and the reception filter 5 can be easily obtained. That is, in order to share a terminal between two filters, the impedance of one filter in the passband of the other filter is preferably infinity. In this preferred embodiment, as described above, the one-port surface acoustic wave resonator 9 is connected in series between the input terminal 6 and each of the first filter element 11 and the second filter element 12 in the reception filter 5. In this case, the impedance of the reception filter 5 is increased in the passband of the transmission filter 4. Accordingly, by appropriately setting the capacitance value of the surface acoustic wave resonator 9, the phase matching between the transmission filter 4 and the reception filter 5 can be achieved without using an impedance matching transmission line or another phase matching element, for example, an inductor or a capacitor. Consequently, the size and required mounting area of a duplexer can be reduced. This enables a mobile telephone including the duplexer 1 to be miniaturized.

In the duplexer 1 according to this preferred embodiment of the present invention, since the transmission filter 4 has a ladder circuit configuration, a relatively large amount of electric power is likely to enter the reception filter 5. In the reception filter 5, however, the input terminal 6 is connected in parallel to the first filter element 11 and the second filter element 12, the first filter element 11 includes the first longitudinally coupled resonator surface acoustic wave filter portion 21 and the second longitudinally coupled resonator surface acoustic wave filter portion 22 which are cascade connected, and the second filter element 12 includes the third longitudinally coupled resonator surface acoustic wave filter portion 25 and the fourth longitudinally coupled resonator surface acoustic wave filter portion 26 which are cascade connected. Thus, the power handling performance of the reception filter 5 is improved. Accordingly, the reception filter 5 is prevented from being damaged by the electric power supplied from the transmission filter 4.

Next, the transmission characteristic of a duplexer according to this preferred embodiment will be described with reference to concrete examples of an experiment.

Figure 2:
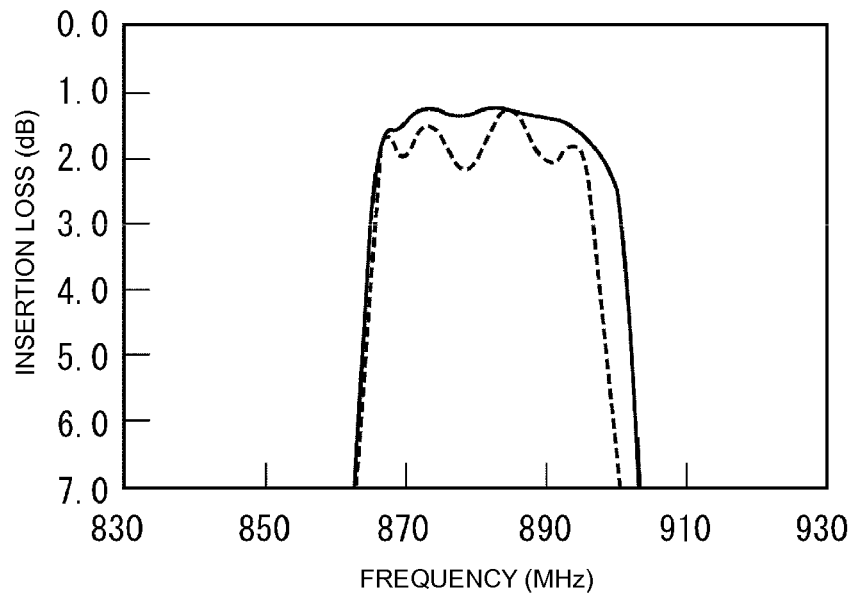
FIG. 2 is a diagram illustrating transmission characteristics of reception filters that are individually included in a duplexer according to the first preferred embodiment of the present invention and a duplexer in the related art.
Figure 3:
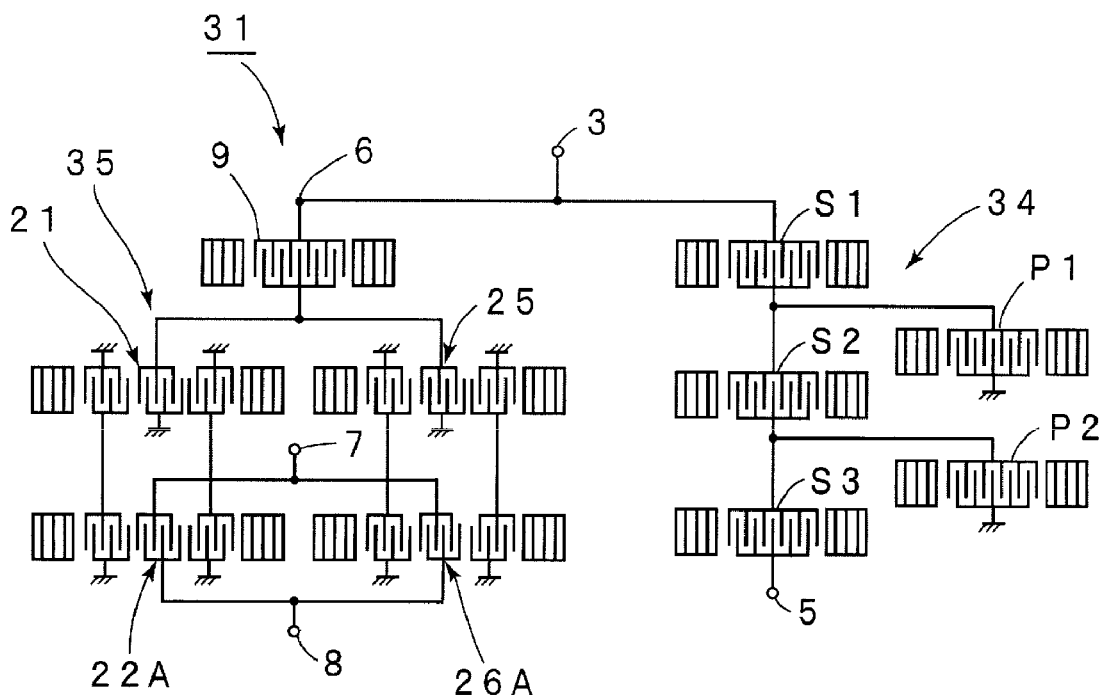
FIG. 3 is a schematic plan view illustrating an electrode structure of a duplexer in the related art having a transmission characteristic illustrated in FIG. 2 with a broken line.

The duplexer 1 was designed such that the impedance of the antenna terminal 3 was set to about 50Ω and the impedance of the first reception output terminal 7 and the second reception output terminal 8 was set to about 200Ω. Referring to FIG. 2, a solid line denotes the characteristic of transmission from the antenna terminal 3 to each of the first reception output terminal 7 and the second reception output terminal 8, and a broken line denotes the phase characteristic of a duplexer in the related art illustrated in FIG. 3. In a duplexer 31 in the related art illustrated in FIG. 3, a transmission filter 34 is substantially the same as the transmission filter 4. Similar to the first preferred embodiment of the present invention, in a reception filter 35, the input terminal 6 is connected in parallel to the longitudinally coupled resonator surface acoustic wave filter portions 21 and 25. However, the reception filter 35 differs from a reception filter according to the first preferred embodiment in that they include different structures to provide a balanced-to-unbalanced conversion function. That is, one end of the center IDT included in a second longitudinally coupled resonator surface acoustic wave filter portion 22A and one end of the center IDT included in a fourth longitudinally coupled resonator surface acoustic wave filter portion 26A are connected to each other and are then connected to the first reception output terminal 7. The other ends of the center IDTs are connected to each other and are then electrically connected to the second reception output terminal 8. In the duplexer in the related art, as illustrated by the broken line in FIG. 2, a large ripple was generated in a passband. In contrast, in a duplexer according to the first preferred embodiment of the present invention, the generation of a ripple was effectively prevented.

Figure 4:
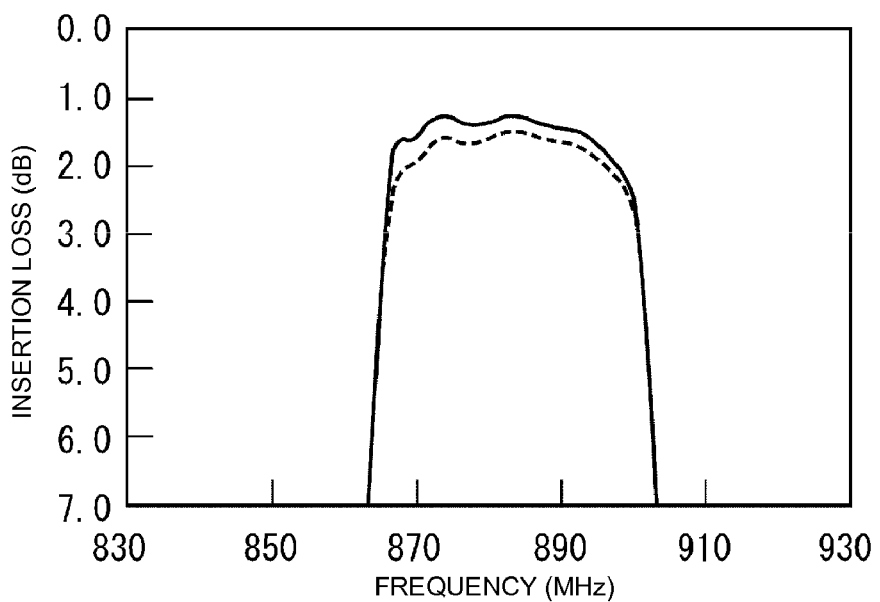
FIG. 4 is a diagram illustrating transmission characteristics of reception filters that are individually included in a duplexer according to the first preferred embodiment of the present invention and a comparative example of a duplexer.
Figure 5:
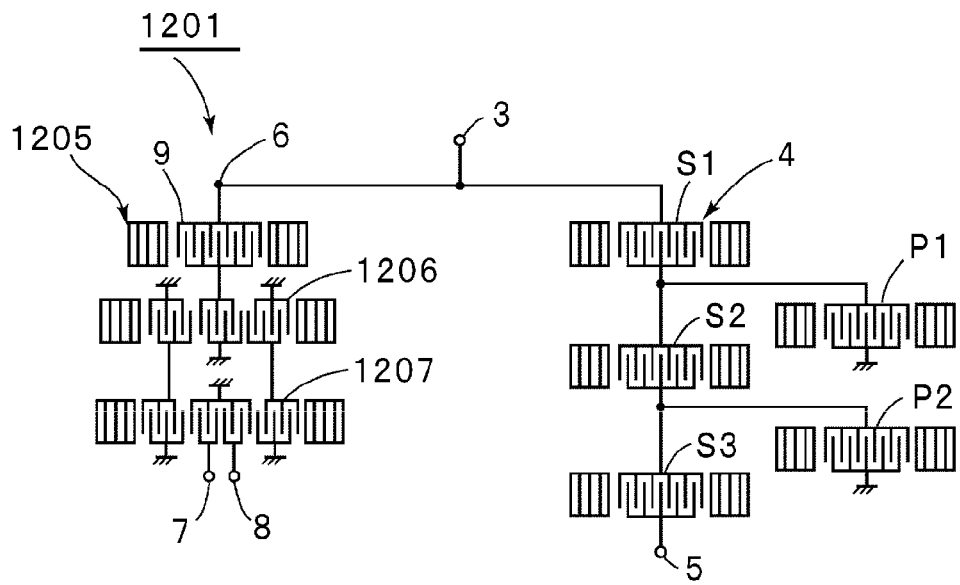
FIG. 5 is a schematic plan view illustrating an electrode structure of a comparative example of a duplexer having a transmission characteristic illustrated in FIG. 4 with a broken line.

Next, FIG. 4 illustrates the transmission characteristic of a duplexer according to the first preferred embodiment using a solid line and the transmission characteristic of a comparative example illustrated in FIG. 5 using a broken line.

Figure 17:
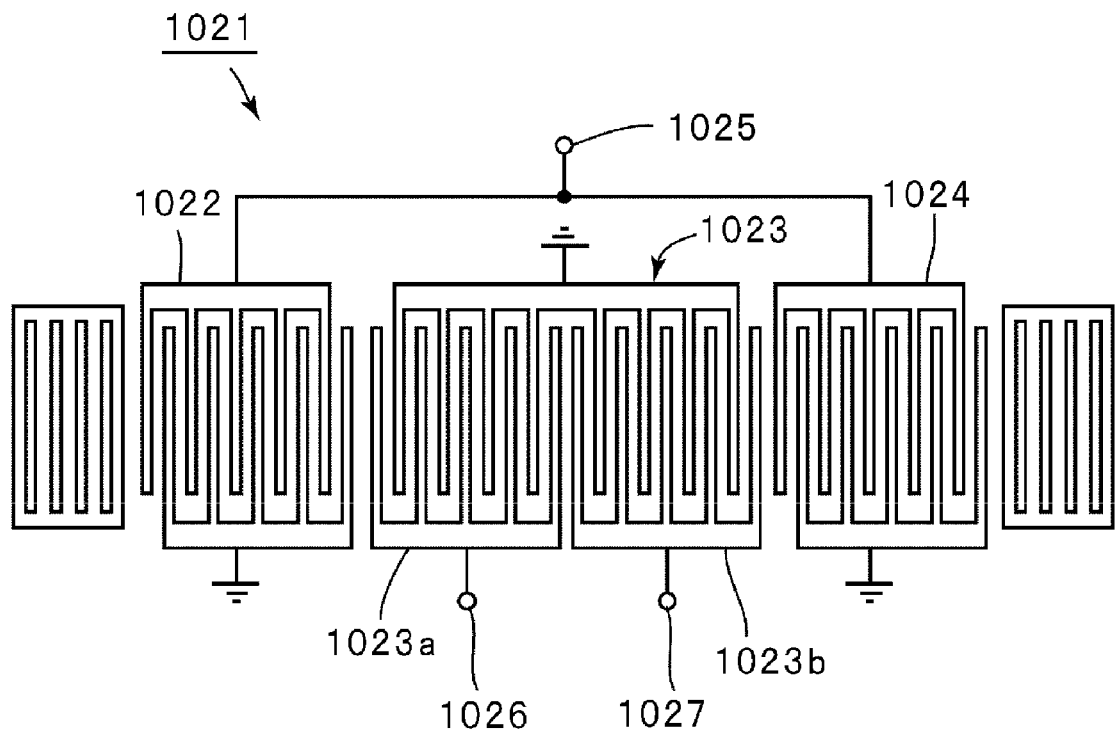
FIG. 17 is a schematic plan view illustrating an exemplary electrode structure of a longitudinally coupled resonator surface acoustic wave filter in the related art.

As shown in FIG. 5, in a reception filter 1205 included in a duplexer 1201 of a comparative example, longitudinally coupled resonator surface acoustic wave filter portions 1206 and 1207 are cascade connected to the one-port surface acoustic wave resonator 9. The longitudinally coupled resonator surface acoustic wave filter portions 1206 and 1207 are substantially the same as the longitudinally coupled resonator surface acoustic wave filter 1021 in the related art illustrated in FIG. 17. Other than this difference, the duplexer 1201 has substantially the same structure as that of the duplexer 1.

As shown in FIG. 4, according to the first preferred embodiment of the present invention, a maximum insertion loss of about 0.5 dB less than that of the duplexer 1201 of the above-described comparative example, can be obtained in a passband. The reason for this is that substantially the same impedance ratio can be achieved with about half of the cross width of IDTs since the first filter element 11 and the second filter element 12 are connected in parallel to each other, and a loss caused by the resistance of electrode fingers can be reduced. Therefore, according to the first preferred embodiment, a duplexer is provided which includes a low-loss reception filter.

Furthermore, in the duplexer 1201 of the above-described comparative example, the reception filter 1205 is easily damaged since electric power supplied from the transmission filter 4 cannot be distributed. In contrast, in the first preferred embodiment, since electric power entering the first filter element 11 and the second filter element 12 is distributed, the power handling performance is effectively improved.

Therefore, according to the first preferred embodiment of the present invention, a low-loss duplexer is provided which includes a reception filter having a balanced-to-unbalanced conversion function and improved power handling performance.

The transmission filter 4 and the reception filter 5 are preferably provided on a single piezoelectric substrate. However, the transmission filter 4 and the reception filter 5 may be provided on different piezoelectric substrates; and the output terminal of the transmission filter 4, the input terminal of the reception filter 5, and the antenna terminal 3 may be connected to each other in a package.

Second Preferred Embodiment

Figure 6:
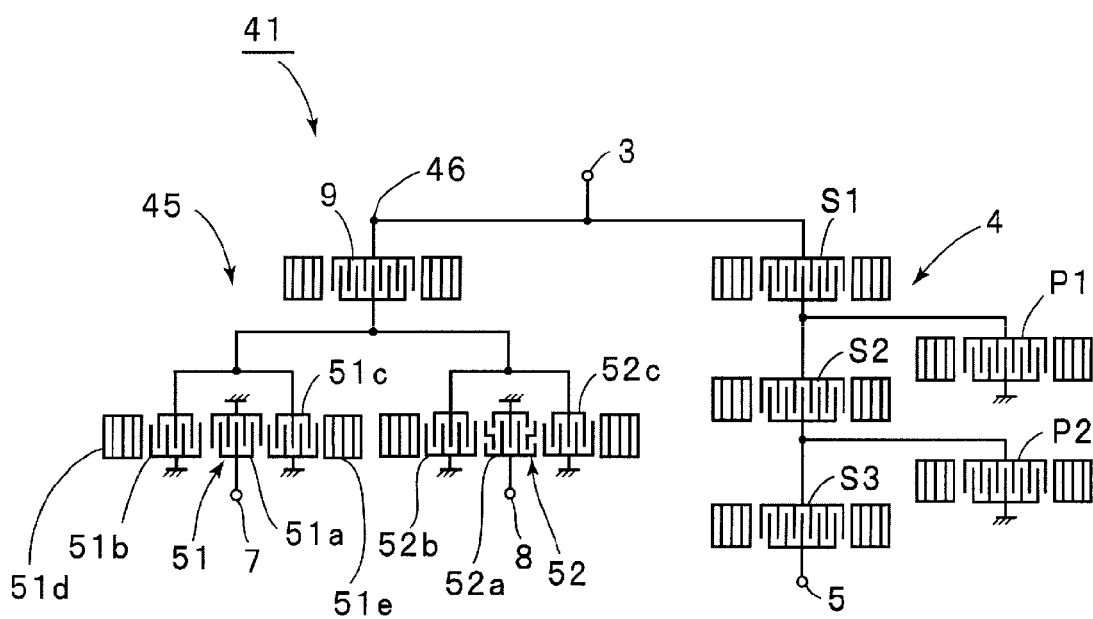
FIG. 6 is a schematic plan view illustrating an electrode structure of a duplexer according to a second preferred embodiment of the present invention.

FIG. 6 is a plan view illustrating an electrode structure of a duplexer according to a second preferred embodiment of the present invention. A duplexer 41 is substantially the same as the duplexer 1 according to the first preferred embodiment except for a reception filter 45.

In the reception filter 45, the one-port surface acoustic wave resonator 9 is connected to an input terminal 46, and is connected in parallel to a first filter element 51 and a second filter element 52. The first filter element 51 is a longitudinally coupled resonator surface acoustic wave filter element including a second IDT 51b, a first IDT 51a, and a third IDT 51c which are arranged in this order along a surface acoustic wave propagation direction. The second filter element is also a longitudinally coupled resonator surface acoustic wave filter element including a second IDT 52b, a first IDT 52a, and a third IDT 52c which are arranged in this order along the surface acoustic wave propagation direction.

In the second preferred embodiment, the phase of an output signal with respect to an input signal in the second filter element 52 differs by about 180° from the phase of an output signal with respect to an input signal in the first filter element 51 so as to provide a balanced-to-unbalanced conversion function. More specifically, the first IDT 51a is substantially opposite in phase to the first IDT 52a so as to provide a balanced-to-unbalanced conversion function.

The second IDT 51b and the third IDT 51c are connected to the input terminal 46 via the surface acoustic wave resonator 9. The second IDT 52b and the third IDT 52c, which are included in the second filter element 52, are connected to the input terminal 46 via the surface acoustic wave resonator 9. One end of the first IDT 51a of the first filter element 51 is connected to the first reception output terminal 7, and one end of the first IDT 52a of the second filter element 52 is connected to the second reception output terminal 8.

Similar to the first preferred embodiment, in the second preferred embodiment of the present invention, the first filter element 51 and the second filter element 52, which are first and second longitudinally coupled resonator surface acoustic wave filter elements, respectively, are connected in parallel to the input terminal 46. Accordingly, even if electric power enters the reception filter 45 from the transmission filter 4 having a ladder circuit configuration, the reception filter 45 having the improved power handling performance is not damaged.

Since the balanced-to-unbalanced conversion function is achieved as described above, a ratio of output impedance to input impedance can be set to a value greater than about one.

That is, if an input impedance is set to about one, an output impedance having a value greater than about one can be obtained. Accordingly, when the first reception output terminal 7 and the second reception output terminal 8 are connected to a balanced input located at a subsequent stage, impedance matching can be easily achieved.

Since the value of the ratio of output impedance to input impedance is about four, a low-loss duplexer 41 is provided. In the second preferred embodiment, series weighting is performed upon either end of the first IDT 52a in a surface acoustic wave propagation direction so as to prevent deterioration of the amplitude balance and the phase balance between the first reception output terminal 7 and the second reception output terminal 8. With a structure in which the first IDT 52a and the first IDT 51a have substantially opposite polarities, the relationship of the polarities of electrode fingers adjacent to each other among the center IDT and IDTs on the either side of the center IDT in the first filter element 51 is different from the relationship between the polarities of electrode fingers adjacent to each other among the center IDT and IDTs on the either side of the center IDT in the second filter element 52. As a result, the amplitude balance and the phase balance between the first reception output terminal 7 and the second reception output terminal 8 are deteriorated. That is, by performing series weighting, the relationship of polarities of adjacent electrode fingers among the center IDT 52a, the second IDT 52b on one side of the center IDT 52a, and the third IDT 52c on the other side of the center IDT 52a in the second filter element 52 may be closer to the relationship of polarities of adjacent electrode fingers among the center IDT 51a, the second IDT 51b on one side of the center IDT 51a, and the third IDT 51c on the other side of the center IDT 51a in the second filter element 52. As a result, the deterioration of the amplitude balance and the phase balance is prevented.

Referring to FIG. 6, the second IDT 51b, the third IDT 51c, the second IDT 52b, and the third IDT 52c are connected to the input terminal 46. However, the center IDTs 51a and 52b may be connected to the input terminal 46. In this case, the second IDT 51b and the third IDT 51c may be connected to each other and then be connected to the first reception output terminal 7, and the second IDT 52b and the third IDT 52c may be connected to each other and then be connected to the second reception output terminal 8.

Figure 7:
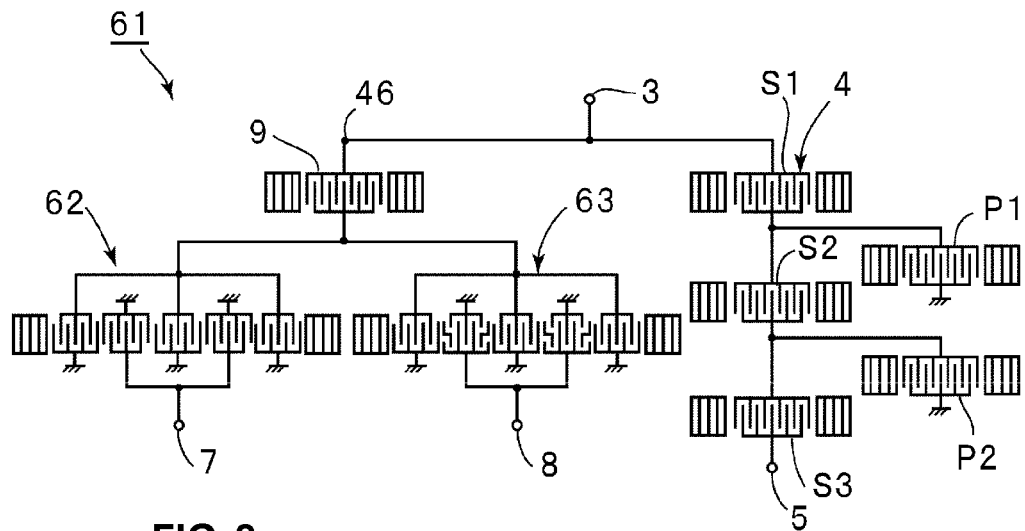
FIG. 7 is a schematic plan view illustrating an electrode structure of an exemplary modification of a duplexer according to the second preferred embodiment of the present invention.

FIG. 7 illustrates an exemplary modification of the duplexer 41 according to the second preferred embodiment of the present invention. In a duplexer 61 of an exemplary modification, each of a first filter element 62 and a second filter element 63 is a 5-IDT longitudinally coupled resonator surface acoustic wave filter element. Thus, the first filter element 62 and the second filter element 63 may be a 5-IDT longitudinally coupled resonator surface acoustic wave filter element, as an alternative to the 3-IDT longitudinally coupled resonator surface acoustic wave filter element according to the second preferred embodiment of the present invention.

Figure 8:
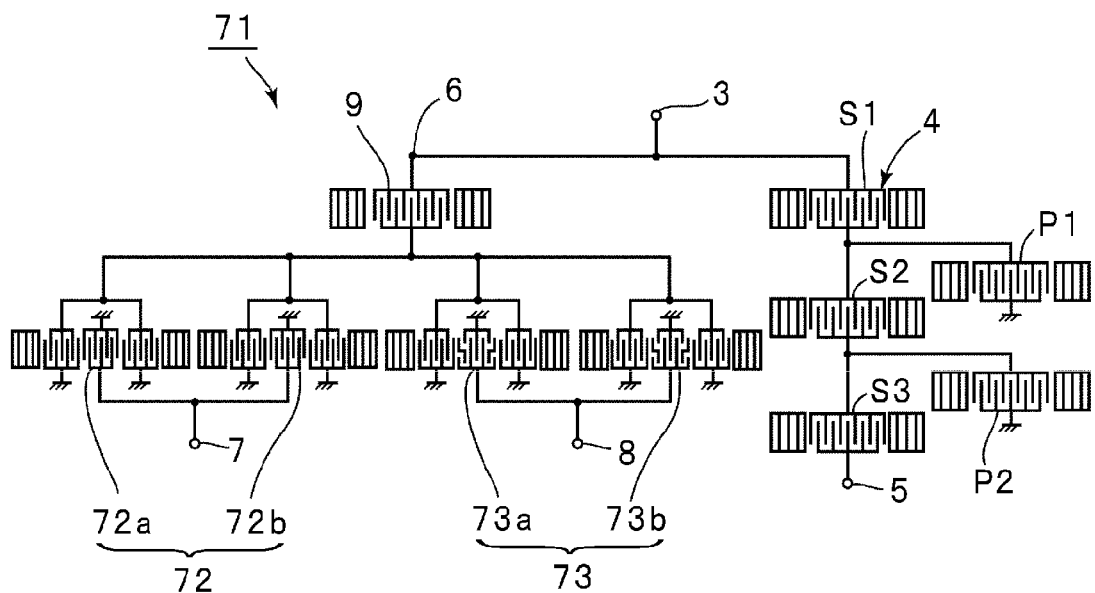
FIG. 8 is a schematic plan view illustrating an electrode structure of another exemplary modification of a duplexer according to the second preferred embodiment of the present invention.

FIG. 8 is a schematic plan view illustrating a duplexer 71 that is another exemplary modification of the duplexer 41.

In a first filter element 72 included in the duplexer 71, a plurality of 3-IDT longitudinally coupled resonator surface acoustic wave filters 72a and 72b are connected in parallel to each other. In a second filter element 73 included in the duplexer 71, a plurality of 3-IDT longitudinally coupled resonator surface acoustic wave filters 73a and 73b are similarly connected in parallel to each other. Thus, each of the first and second filter elements may be configured such that a plurality of longitudinally coupled resonator surface acoustic wave filters are connected in parallel to each other.

Third Preferred Embodiment

Figure 9:
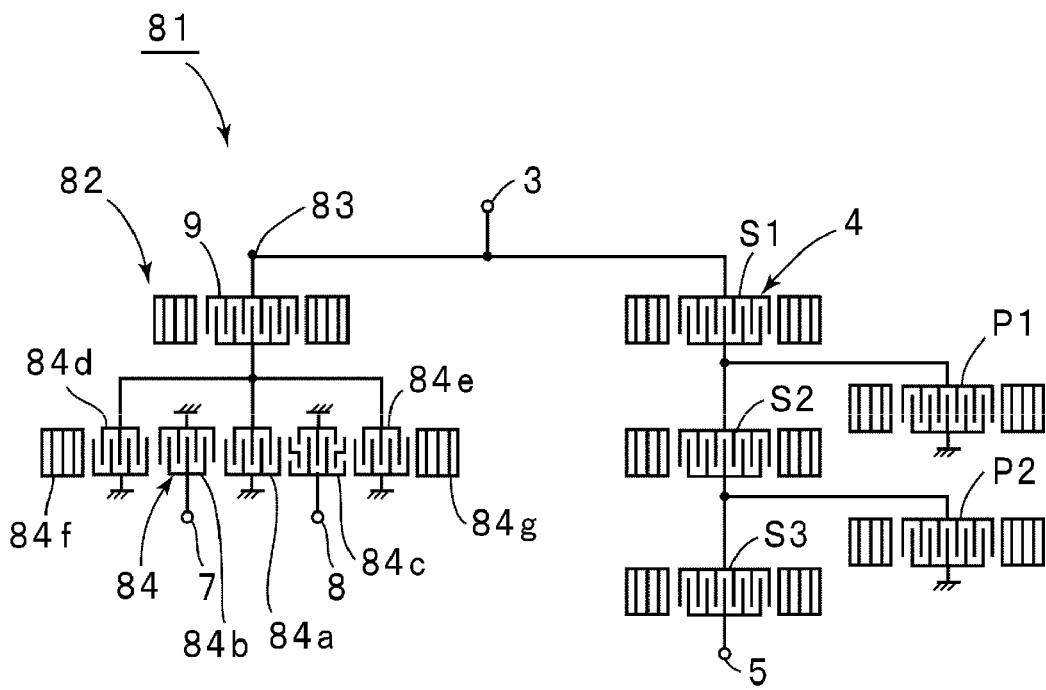
FIG. 9 is a schematic plan view illustrating an electrode structure of a duplexer according to a third preferred embodiment of the present invention.

FIG. 9 is a schematic plan view illustrating an electrode structure of a duplexer according to the third embodiment of the present invention. A duplexer 81 is substantially the same as the duplexer 1 according to the first preferred embodiment except that a reception filter 82 is different from the reception filter 5.

The reception filter 82 includes an input terminal 83, the first reception output terminal 7, and the second reception output terminal 8. The input terminal 83 is connected to one end of the one-port surface acoustic wave resonator 9. The other end of the one-port surface acoustic wave resonator 9 is connected to a 5-IDT longitudinally coupled resonator filter element 84. The 5-IDT longitudinally coupled resonator filter element 84 includes a fourth IDT 84d, a second IDT 84b, a first IDT 84a, a third IDT 84c, and a fifth IDT 84e which are arranged in this order on a piezoelectric substrate along a surface acoustic wave propagation direction. A first reflector 84f is disposed on one side of an area in which the IDTs 84a to 84e are disposed, and a second reflector 84g is disposed on the other side of the area.

The second IDT 84b is about 180° out of phase with the third IDT 84c. Accordingly, a pair of balanced outputs can be obtained from the first reception output terminal 7 connected to the second IDT 84b and the second reception output terminal 8 connected to the third IDT 84c.

Ends of the first IDT 84a, the fourth IDT 84d, and the fifth IDT 84e are connected to each other and are then connected to the input terminal 83 via the one-port surface acoustic wave resonator 9.

Similar to the above-described preferred embodiments, in the third preferred embodiment of the present invention, the ratio of an input impedance to an output impedance preferably is about 1:4, for example. Accordingly, when the reception filter is connected to a balanced input included in a subsequent stage, impedance matching can be easily achieved. Furthermore, since the total number of pairs of electrode fingers in the 5-IDT longitudinally coupled resonator surface acoustic wave filter element 84 is greater than the total number of pairs of electrode fingers in a 3-IDT longitudinally coupled resonator surface acoustic wave filter, the cross width can be reduced. As a result, a lower loss can be achieved. Since the input terminal 83 is connected in parallel to three IDTs 84a, 84d, 84e, electric power supplied from the transmission filter 4 is effectively distributed. Thus, the power handling performance is effectively improved.

Fourth Preferred Embodiment

Figure 10:
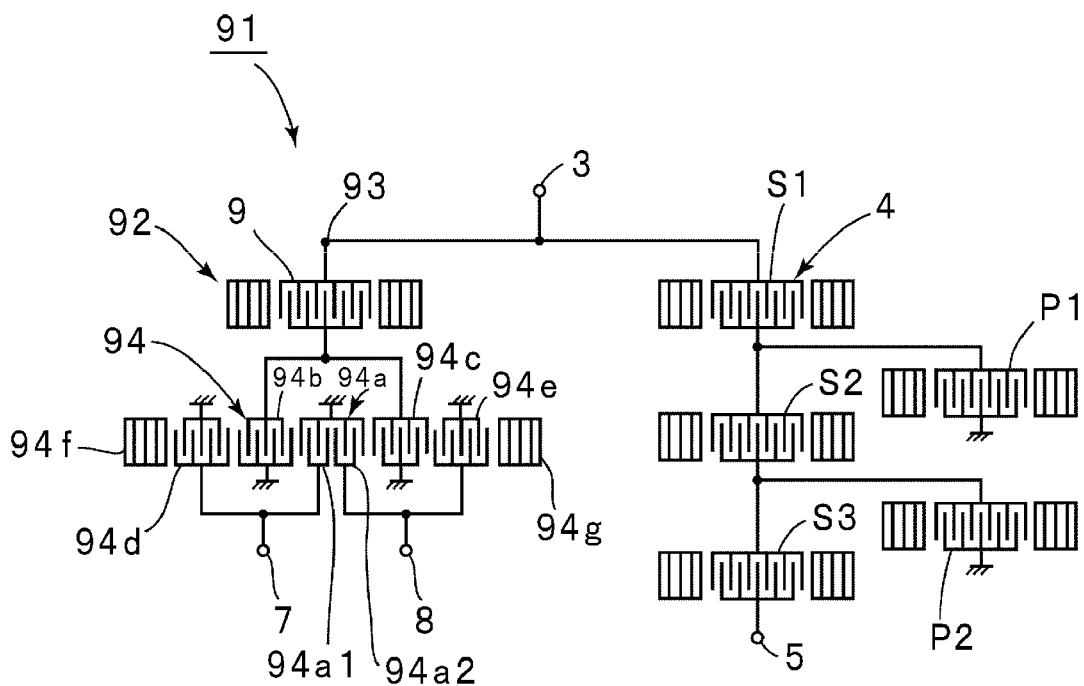
FIG. 10 is a schematic plan view illustrating an electrode structure of a duplexer according to a fourth preferred embodiment of the present invention.

FIG. 10 is a schematic plan view illustrating an electrode structure of a duplexer according to the fourth preferred embodiment of the present invention.

A duplexer 91 according to the fourth preferred embodiment is substantially the same as the duplexer 1 except that the structure of a reception filter 92 is different from that of the reception filter 5. In the reception filter 92, an input terminal 93 is connected to one end of the one-port surface acoustic wave resonator 9. The other end of the one-port surface acoustic wave resonator 9 is connected to a longitudinally coupled resonator surface acoustic wave filter element 94. The longitudinally coupled resonator surface acoustic wave filter element 94 is a 5-IDT longitudinally coupled resonator surface acoustic wave filter element including a fourth IDT 94d, a second IDT 94b, a first IDT 94a, a third IDT 94c, and a fifth IDT 94e which are arranged in this order on a piezoelectric substrate along a surface acoustic wave propagation direction. A first reflector 94f is disposed on one side of an area in which the IDTs 94a to 94e are disposed, and a second reflector 94g is disposed on the other side of the area.

One end of the second IDT 94b and one end of the third IDT 94c are connected to each other and are then connected to the input terminal 93 via the one-port surface acoustic wave resonator 9. The first IDT 94a defining the center IDT includes a first sub-IDT portion 94a1 and a second sub-IDT portion 94a2 which are obtained by dividing the first IDT 94a in the surface acoustic wave propagation direction. The second sub-IDT portion 94a1 and the fourth IDT 94d are connected to each other and are then connected to the first reception output terminal 7. The second sub-IDT portion 94a2 and the fifth IDT 94e are connected to each other and are then connected to the second reception output terminal 8.

Similar to the above-described preferred embodiments, in the fourth preferred embodiment of the present invention, the ratio of an input impedance to an output impedance can also be set to about 1:4 in the reception filter 92. Therefore, the impedance matching between the reception filter 92 and a balanced input included in a subsequent stage can be easily achieved. Similar to the third preferred embodiment, in the fourth preferred embodiment, the 5-IDT longitudinally coupled resonator surface acoustic wave filter element 94 is provided. Accordingly, a loss can be similarly reduced.

Similar to the above-described preferred embodiments, in the fourth preferred embodiment, the input terminal 93 is connected in parallel to a plurality of IDTs, that is, the IDTs 94b and 94c. Accordingly, the power handling performance can be similarly improved.

Fifth Preferred Embodiment

Figure 11:
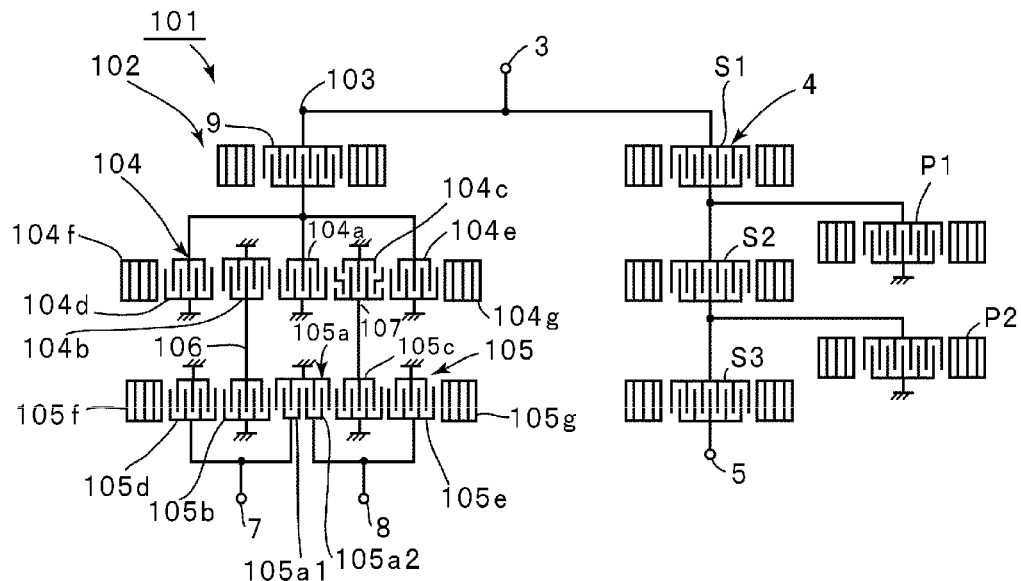
FIG. 11 is a schematic plan view illustrating an electrode structure of a duplexer according to a fifth preferred embodiment of the present invention.

FIG. 11 is a schematic plan view illustrating an electrode structure of a duplexer according to a fifth preferred embodiment of the present invention.

A duplexer 101 according to the fifth preferred embodiment is substantially the same as the duplexer 1 according to the first preferred embodiment except that the structure of a reception filter 102 is different from that of the reception filter 5. The reception filter 102 includes an input terminal 103, the first reception output terminal 7, and the second reception output terminal 8. The input terminal 103 is connected to one end of the one-port surface acoustic wave resonator 9. The other end of the one-port surface acoustic wave resonator 9 is connected to one end of a first 5-IDT surface acoustic wave filter element 104. The first surface acoustic wave filter element 104 includes a fourth IDT 104d, a second IDT 104b, a first IDT 104a, a third IDT 104c, and a fifth IDT 104e which are arranged in this order along a surface acoustic wave propagation direction. A first reflector 104f is disposed on one side of an area in which the IDTs 104a to 104e are disposed, and a second reflector 104g is disposed on the other side of the area. One ends of the first IDT 104a, the fourth IDT 104d, and the fifth IDT 104e are connected to each other and are then connected to the input terminal 103 via the one-port surface acoustic wave resonator 9. The first longitudinally coupled resonator surface acoustic wave filter element 104 is connected to a second surface acoustic wave filter element 105 that is located at the subsequent stage of the first longitudinally coupled resonator surface acoustic wave filter element 104. The second surface acoustic wave filter element 105 includes a fourth IDT 105d, a second IDT 105b, a first IDT 105a, a third IDT 105c, and a fifth IDT 105e which are arranged in this order along the surface acoustic wave propagation direction. A first reflector 105f is disposed on one side of an area in which the IDTs 105a to 105e are disposed, and a second reflector 105g is disposed on the other side of the area.

In the fifth preferred embodiment of the present invention, the second IDT 105b and the third IDT 105c are connected to the second IDT 104b and the third IDT 104c, which are included in the first surface acoustic wave filter element 104, via a signal line 106 and a signal line 107, respectively, whereby the first surface acoustic wave filter element 104 and the second surface acoustic wave filter element 105 are cascade connected.

The first IDT 105a includes a first sub-IDT portion 105a1 and a second sub-IDT portion 105a2 which are obtained by dividing the first IDT 105a in the surface acoustic wave propagation direction. One end of the first sub-IDT portion 105a1 and one end of the fourth IDT 105d are connected to each other and are then connected to the first reception output terminal 7. One end of the second sub-IDT portion 105a2 and one end of the fifth IDT 105e are connected to each other and are then connected to the second reception output terminal 8.

Similar to the above-described preferred embodiments, in the fifth preferred embodiment, the ratio of an impedance on the side of the input terminal 103 to an output impedance on the side of the first reception output terminal 7 and the second reception output terminal 8 can also be set to about 1:4. Therefore, when the reception filter is connected to a balanced input included in a subsequent stage, impedance matching can be easily achieved.

Since the 5-IDT surface acoustic wave filter elements 104 and 105 are used, the cross width of electrode fingers can preferably be reduced. Accordingly, a loss can be reduced.

Furthermore, similar to the above-described preferred embodiments, in the fifth preferred embodiment, the input terminal 103 is connected to a plurality of IDTs 104a, 104d, and 104e. Accordingly, the power handling performance can be similarly improved.

In addition, in the fifth preferred embodiment of the present invention, a signal passing through the signal line 106 is substantially opposite in phase to a signal passing through the signal line 107. Accordingly, the amplitude balance and the phase balance between the first reception output terminal 7 and the second reception output terminal 8 can be improved.

Series weighting is performed upon both ends of the IDT 104c in the surface acoustic wave propagation direction so as to prevent the deterioration of the balance between the reception output terminals 7 and 8 as described with respect to the IDT 84c.

Sixth Preferred Embodiment

Figure 12:
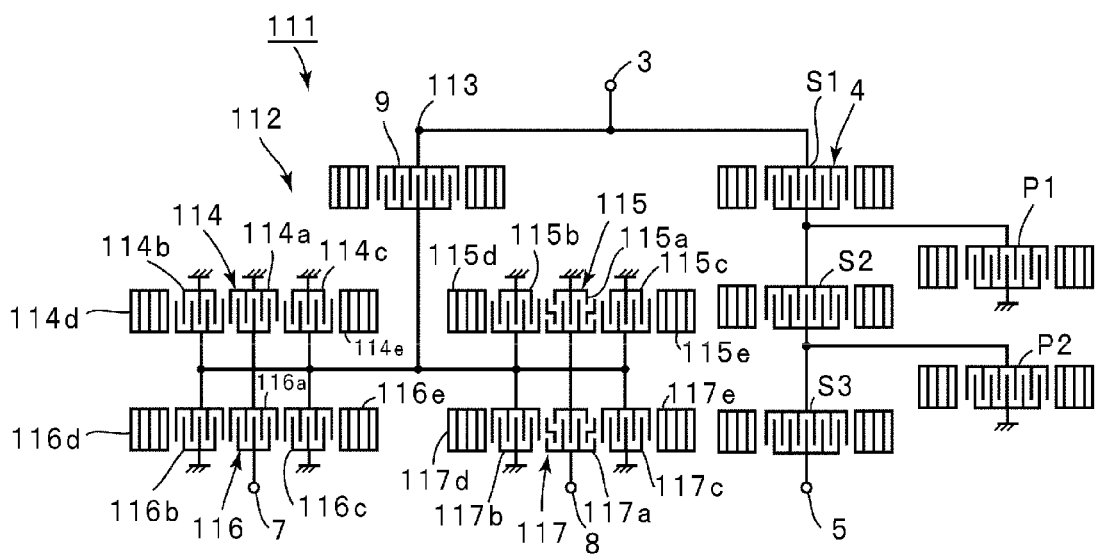
FIG. 12 is a schematic plan view illustrating an electrode structure of a duplexer according to a sixth preferred embodiment of the present invention.

FIG. 12 is a schematic plan view illustrating an electrode structure of a duplexer according to the sixth preferred embodiment of the present invention.

In a duplexer 111 according to the sixth preferred embodiment, a reception filter 112 includes an input terminal 113, the first reception output terminal 7, and the second reception output terminal 8. The input terminal 113 is connected to one end of the one-port surface acoustic wave resonator 9. The other end of the one-port surface acoustic wave resonator 9 is connected to a first filter element 114, a second filter element 115, a third filter element 116, and a fourth filter element 117. Each of the first filter element 114 to the fourth filter element 117 is a 3-IDT longitudinally coupled resonator surface acoustic wave filter element including reflectors and three IDTs which are arranged along a surface acoustic wave propagation direction. That is, the first filter element 114 includes a second IDT 114b, a first IDT 114a, a third IDT 114c, and reflectors 114d and 114e, the second filter element 115 includes a second IDT 115b, a first IDT 115a, a third IDT 115c, and reflectors 115d and 115e, the third filter element 116 includes a second IDT 116b, a first IDT 116a, a third IDT 116c, and reflectors 116d and 116e, and the fourth filter element 117 includes a second IDT 117b, a first IDT 117a, a third IDT 117c, and reflectors 117d and 117e.

The input terminal 113 is connected to ends of the second IDTs 114b to 117b and the third IDTs 114c to 117c. One end of the first IDT 114a defining the center IDT of the first filter element 114 is connected to one end of the first IDT 116a defining the center IDT of the third filter element 116, and the other end of the first IDT 116a is connected to the first reception output terminal 7. One end of the first IDT 115a defining the center IDT of the second filter element 115 is connected to one end of the first IDT 117a defining the center IDT of the fourth filter element 117, and the other end of the first IDT 117a is connected to the second reception output terminal 8.

The IDTs 115a and 117a have substantially opposite phases to the IDTs 114a and 116a. Accordingly, a pair of balanced output signals are obtained from the first reception output terminal 7 and the second reception output terminal 8. Series weighting is performed upon both ends of each of the IDTs 115a and 117a in the surface acoustic wave propagation direction so as to prevent a deterioration of the balance between the first reception output terminal 7 and the second reception output terminal 8 as described with respect to the IDT 84c according to the third preferred embodiment.

Similar to the above-described preferred embodiments, in the sixth preferred embodiment, the input terminal 113 is connected in parallel to a plurality of IDTs 114b, 114c, 115b, 115c, 116b, 116c, 117b, and 117c, such that the power handling performance can be effectively improved.

In the sixth preferred embodiment, the ratio of an input impedance to an output impedance can be set to about 1:16 in the reception filter 112. Thus, the ratio of output impedance to input impedance can be further increased.

Furthermore, since the first filter element 114 to the fourth filter element 117 are connected in parallel to each other, a loss can be reduced.

In the sixth preferred embodiment, the second IDTs 114b to 117b and the third IDTs 114c to 117c are connected to the input terminal 113. However, the IDTs 114b and 114c may be connected in series to the IDTs 116b and 116c, respectively, and ends of the IDTs 116b and 116c may be connected to each other and then be connected to the first reception output terminal 7. Furthermore, the IDTs 115b and 115c may be connected in series to the IDTs 117b and 117c, respectively, and one ends of the IDTs 117b and 117c may be connected to each other and then be connected to the second reception output terminal 8. In this case, the input terminal 113 may be connected to the first IDTs 114a to 117a.

Seventh Preferred Embodiment

Figure 13:
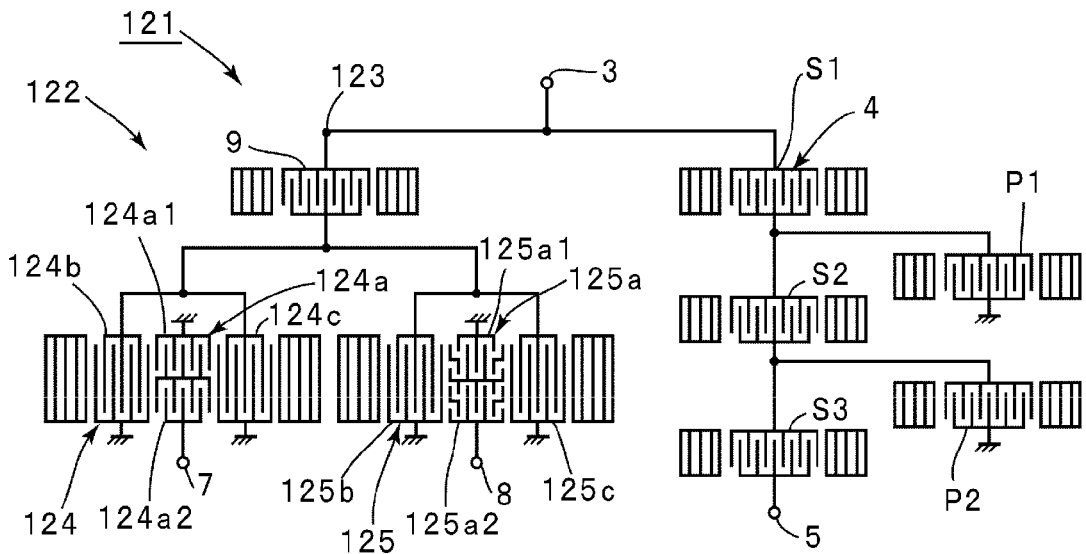
FIG. 13 is a schematic plan view illustrating an electrode structure of a duplexer according to a seventh preferred embodiment of the present invention.

FIG. 13 is a schematic plan view illustrating an electrode structure of a duplexer according to the seventh preferred embodiment of the present invention. In a duplexer 121 according to the seventh preferred embodiment, a reception filter 122 includes an input terminal 123, the first reception output terminal 7, and the second reception output terminal 8. The input terminal 123 is connected to one end of the one-port surface acoustic wave resonator 9. The other end of the one-port surface acoustic wave resonator 9 is connected to a first filter element 124 and a second filter element 125. The first filter element 124 is a 3-IDT longitudinally coupled resonator surface acoustic wave filter including a second IDT 124b, a first IDT 124a, and a third IDT 124c which are arranged in this order along a surface acoustic wave propagation direction. The second filter element 125 is also a 3-IDT longitudinally coupled resonator surface acoustic wave filter including a second IDT 125b, a first IDT 125a, and a third IDT 125c which are arranged in this order along the surface acoustic wave propagation direction.

In the seventh preferred embodiment, ends of the second IDT 124b and the third IDT 124c are connected to each other and are then connected to the input terminal 123 via the one-port surface acoustic wave resonator 9. The first IDT 124a defining the center IDT, is divided in a direction substantially perpendicular to the surface acoustic wave propagation direction into a first sub-IDT portion 124a1 and a second sub-IDT portion 124a2. One end of the first sub-IDT portion 124a1 is connected to the ground potential, the other end of the first sub-IDT portion 124a1 is connected to the second sub-IDT portion 124a2, and the second sub-IDT portion 124a2 is connected to the first reception output terminal 7.

Ends of the second IDT 125b and the third IDT 125c are connected to each other and are then connected to the input terminal 123 via the one-port surface acoustic wave resonator 9. The first IDT 125a defining the center IDT is divided in a direction substantially perpendicular to the surface acoustic wave propagation direction into a first sub-IDT portion 125a1 and a second sub-IDT portion 125a2. In the seventh preferred embodiment, one end of the first sub-IDT portion 125a1 is connected to a ground potential, the other end of the first sub-IDT portion 125a1 is connected to the second sub-IDT portion 125a2, and the second sub-IDT portion 125a2 is connected to the second reception output terminal 8.

The first IDT 125a has a phase that is substantially opposite to the phase of the first IDT 124a. Accordingly, a pair of balanced output signals can be obtained from the first reception output terminal 7 and the second reception output terminal 8.

As illustrated in FIG. 13, in the first IDT 125a, series weighting is performed upon both ends of each of the sub-IDT portions 125a1 and 125a2 in the surface acoustic wave propagation direction so as to prevent a deterioration of the amplitude balance and phase balance between the first reception output terminal 7 and the second reception output terminal 8.

Similar to the above-described preferred embodiments, in the seventh preferred embodiment, the ratio of an impedance at the input terminal 123 to an output impedance at the first reception output terminal 7 and the second reception output terminal 8 can be set to about 1:16. The input terminal 123 is connected in parallel to the first filter element 124 and the second filter element 125. Accordingly, a low-loss duplexer capable of achieving high power handling performance is obtained.

Referring to FIG. 13, the first IDTs 124a and 125a defining the center IDTs are electrically connected to the first reception output terminal 7 and the second reception output terminal 8, respectively. However, these IDTs may be connected to the input terminal 123 via the one-port surface acoustic wave resonator 9. In this case, the other ends of the IDTs 124b and 124c may be connected to each other and then be connected to the first reception output terminal 7, and the other ends of the IDTs 125b and 125c may be connected to each other and then be connected to the second reception output terminal 8.

If each of the IDTs 124b, 124c, 125b, and 125c is connected to the first reception output terminal 7 or the second reception output terminal 8, each of the IDTs 124b, 124c, 125b, and 125c may be divided in the cross width direction into a first sub-IDT portion and a second sub-IDT portion.

Eighth Preferred Embodiment

Figure 14:
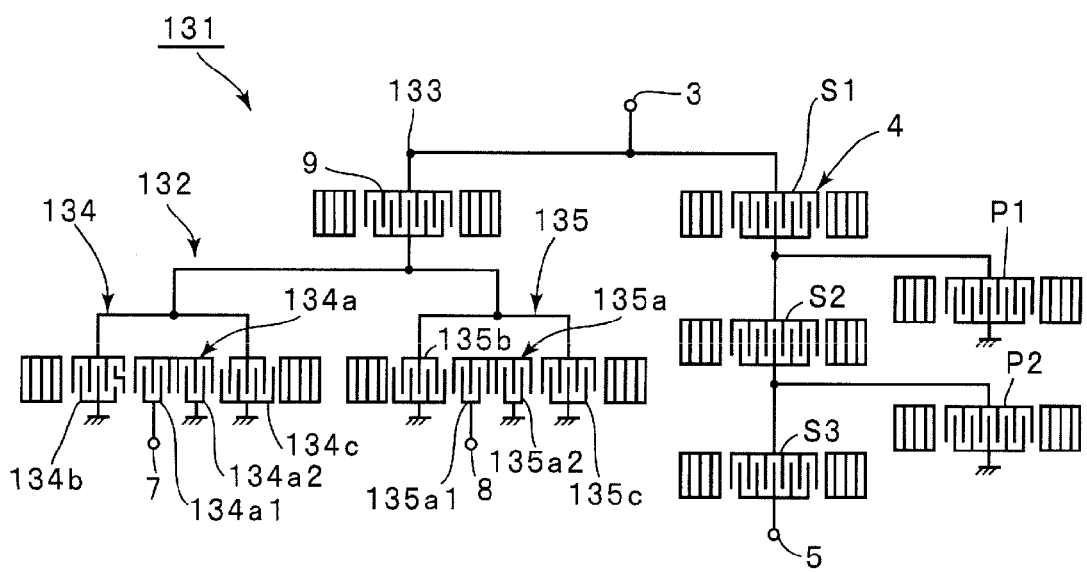
FIG. 14 is a schematic plan view illustrating an electrode structure of a duplexer according to an eighth preferred embodiment of the present invention.

FIG. 14 is a schematic plan view illustrating an electrode structure of a duplexer according to the eighth preferred embodiment of the present invention. In a duplexer 131, a reception filter 132 includes an input terminal 133. The input terminal 133 is connected to one end of the one-port surface acoustic wave resonator 9. The other end of the one-port surface acoustic wave resonator 9 is connected to a first filter element 134 and a second filter element 135. Accordingly, the reception filter 132 included in the duplexer 131 according to the eighth preferred embodiment is similar to the reception filter 45 illustrated in FIG. 6. In the reception filter 45 illustrated in FIG. 6, the IDTs 51a and 52a defining the center IDTs of the 3-IDT longitudinally coupled resonator surface acoustic wave filters 51 and 52 are connected to the reception output terminals 7 and 8, respectively.

On the other hand, in the eighth preferred embodiment, in the first filter element 134 defined by a 3-IDT longitudinally coupled resonator surface acoustic wave filter, a first IDT 134a defining the center IDT includes a first sub-IDT portion 134a1 and a second sub-IDT portion 134a2 which are obtained by dividing the first IDT 134a in a surface acoustic wave propagation direction. In the second filter element 135 defined by a 3-IDT longitudinally coupled resonator surface acoustic wave filter, a first IDT 135a defining the center IDT includes a first sub-IDT portion 135a1 and a second sub-IDT portion 135a2 which are obtained by dividing the first IDT 135a in the surface acoustic wave propagation direction. The first sub-IDT portions 134a1 and 135a1 are connected to the first reception output terminal 7 and the second reception output terminal 8, respectively. The second sub-IDT portions 134a2 and 135a2 are connected to a ground potential.

In the first filter element 134, series weighing is performed upon one end of a second IDT 134b on the side of the first IDT 134a so as to prevent a deterioration of the balance between the first reception output terminal 7 and the second reception output terminal 8.

In the eighth preferred embodiment, the IDTs 134b and 134c a phase that is substantially opposite to the phase of the IDTs 135b and 135c, respectively. Accordingly, a pair of balanced output signals can be obtained from the reception output terminals 7 and 8. Similar to the above-described preferred embodiments, in the eighth preferred embodiment, the ratio of an impedance at the input terminal 133 to an impedance at the reception output terminals 7 and 8 can be set to about 1:16. Accordingly, when the reception filter 122 is connected to a balanced input terminal included in a subsequent stage, impedance matching can be easily improved.

Similar to the above-described preferred embodiments, in the eighth preferred embodiment, the input terminal 133 is connected in parallel to a plurality of IDTs 134b, 134c, 135b, and 135c. Accordingly, the power handling performance can be improved.

Ninth Preferred Embodiment

Figure 15:
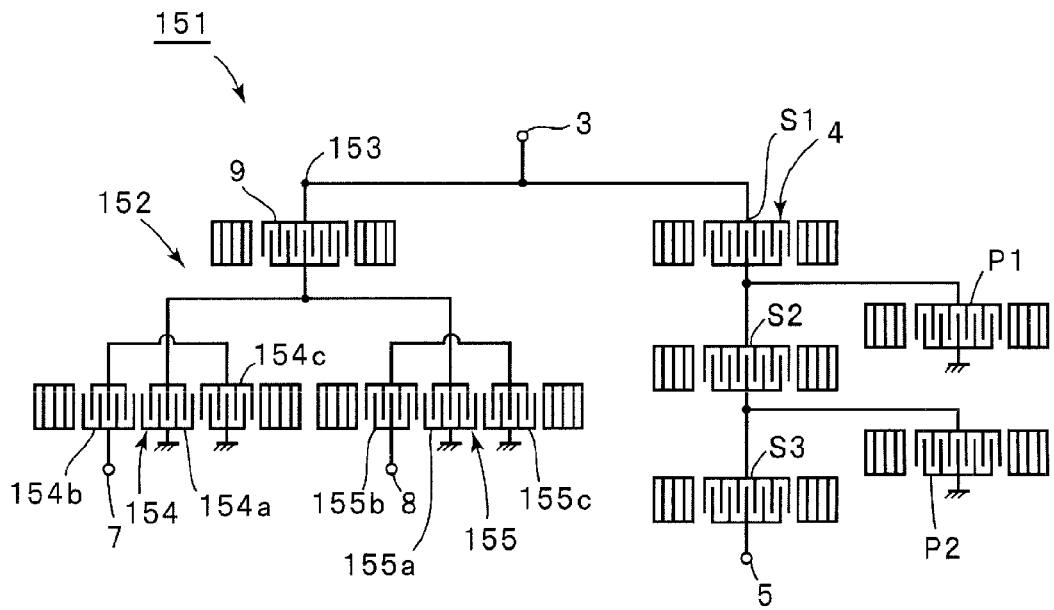
FIG. 15 is a schematic plan view illustrating an electrode structure of a duplexer according to a ninth preferred embodiment of the present invention.
Figure 16:
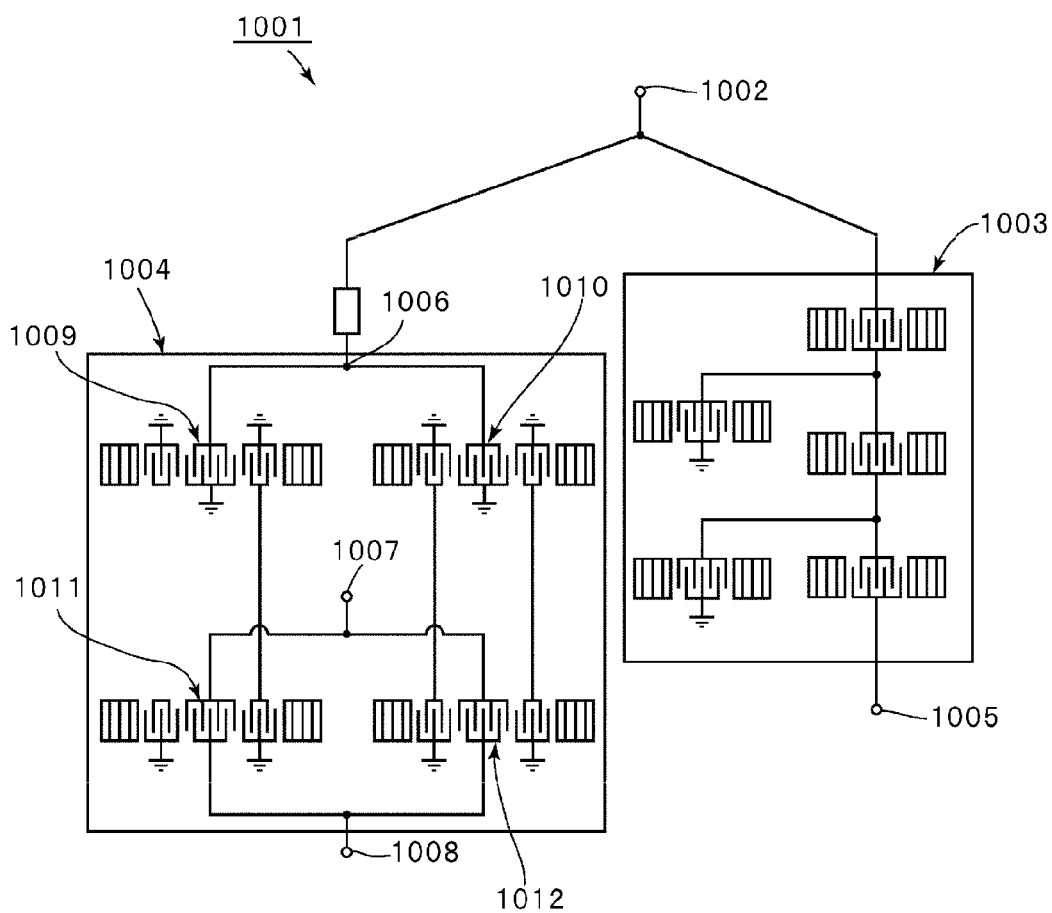
FIG. 16 is a schematic plan view describing an example of a duplexer in the related art.

FIG. 15 is a schematic plan view illustrating an electrode structure of a duplexer according to the ninth preferred embodiment of the present invention.

A duplexer 151 is similar to the duplexer according to the second preferred embodiment illustrated in FIG. 6. However, the duplexer 151 includes a reception filter 152. The reception filter 152 includes an input terminal 153, the first reception output terminal 7, and the second reception output terminal 8. The input terminal 153 is connected to one end of the one-port surface acoustic wave resonator 9. The other end of the one-port surface acoustic wave resonator 9 is connected to a first filter element 154 and a second filter element 155. The first filter element 154 and the second filter element 155 are 3-IDT longitudinally coupled resonator surface acoustic wave filters connected to the first reception output terminal 7 and the second reception output terminal 8, respectively. To this extend, the reception filter 152 is similar to the reception filter 45.

However, in the ninth preferred embodiment, each of the first filter element 154 and the second filter element 155 includes a second IDT, a first IDT, and a third IDT which are arranged in this order along a surface acoustic wave propagation direction. One end of a first IDT 154a defining the center IDT of the first filter element 154 is connected to the input terminal 153 via the one-port surface acoustic wave resonator 9. Ends of a second IDT 154b and a third IDT 154c are connected to each other, the other end of the second IDT 154b is connected to the first reception output terminal 7, and the other end of the third IDT 154c is connected to a ground potential.

One end of a first IDT 155a defining the center IDT of the second filter element 155 is connected to the input terminal 153 via the one-port surface acoustic wave resonator 9. One end of a second IDT 155b that is located on one side of the center IDT and one end of a third IDT 155c that is located on the other side of the center IDT are connected to each other, the other end of the second IDT 155b is connected to the second reception output terminal 8, and the other end of the third IDT 155c is connected to the ground potential.

Accordingly, the first reception output terminal 7 and the second reception output terminal 8 are not connected to the first IDTs 154a and 155a, but rather, are connected to the second IDTs 154b and 155b, respectively. Similar to the above-described preferred embodiments, in the ninth preferred embodiment, the ratio of an impedance at the input terminal 153 to an impedance at the first reception output terminal 7 and the second reception output terminal 8 is set to at least about 1:1. Preferably, the ratio is set to about 1:16, for example. Accordingly, the impedance matching between the reception filter 152 and a balanced input terminal included in a circuit at a subsequent stage connected to the reception filter can be easily achieved.

Similar to the above-described preferred embodiments, in the ninth preferred embodiment, a plurality of IDTs 154a and 155a are connected in parallel to the input terminal 153. Accordingly, the power handling performance can be improved.

The first reception output terminal 7 and the second reception output terminal 8 may not be connected to the second IDTs 154b and 155b, respectively, and instead, may be connected to ends of the third IDTs 154c and 155c. In this case, the other ends of the second IDTs 154b and 155b may be connected to the ground potential.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A duplexer comprising:
   a transmission filter having a ladder circuit configuration; and
   a reception filter; wherein
   one end of the transmission filter and one end of the reception filter are connected to each other and are connected to an antenna terminal;
   the reception filter includes an input terminal, first and second reception output terminals, and first, second, third, and fourth longitudinally coupled resonator filter elements, a phase of an output signal with respect to an input signal of the first longitudinally coupled resonator filter element being different by about 180 degrees from that of the second longitudinally coupled resonator filter element, a phase of an output signal with respect to an input signal of the third longitudinally coupled resonator filter element being different by about 180 degrees from that of the fourth longitudinally coupled resonator filter element;
   each of the first to fourth longitudinally coupled resonator filter elements includes a plurality of IDTs and is connected to the input terminal via at least one of the plurality of IDTs, and the IDTs of the first to fourth longitudinally coupled resonator filter elements which are connected to the input terminal are connected in parallel to each other;
   the third longitudinally coupled resonator filter element is connected to the first reception output terminal via another one of the plurality of IDTs, and the fourth longitudinally coupled resonator filter element is connected to the second reception output terminal via another one of the plurality of IDTs;
   the IDT of the third longitudinally coupled resonator filter element which is connected to the first reception output terminal is connected in series to a corresponding one of the plurality of IDTs of the first longitudinally coupled resonator filter element; and
   the IDT of the fourth longitudinally coupled resonator filter element which is connected to the second reception output terminal is connected in series to a corresponding one of the plurality of IDTs of the second longitudinally coupled resonator filter element.

2. The duplexer according to claim 1, further comprising at least one one-port elastic wave resonator connected in series between the reception filter and a node at which one end of the transmission filter and one end of the reception filter are connected to each other.

3. The duplexer according to claim 2, wherein the longitudinally coupled resonator filter elements and the at least one one-port elastic wave resonator utilize a surface acoustic wave.

4. The duplexer according to claim 2, wherein the longitudinally coupled resonator filter elements and the at least one one-port elastic wave resonator utilize an elastic boundary wave.

* * * * *